(12) United States Patent
Yafune et al.

(10) Patent No.: US 7,759,760 B2
(45) Date of Patent: Jul. 20, 2010

(54) SEMICONDUCTOR SWITCHING ELEMENT AND SEMICONDUCTOR CIRCUIT APPARATUS

(75) Inventors: Norimasa Yafune, Nara (JP); John Kevin Twynam, Nara (JP)

(73) Assignee: Sharp Kabushiki Kaisha, Osaka-Shi (JP)

(*) Notice: Subject to any disclaimer, the term of this patent is extended or adjusted under 35 U.S.C. 154(b) by 392 days.

(21) Appl. No.: 11/819,980

(22) Filed: Jun. 29, 2007

(65) Prior Publication Data

US 2008/0006898 A1    Jan. 10, 2008

(30) Foreign Application Priority Data

Jul. 6, 2006    (JP)    ............... 2006-187177

(51) Int. Cl.
*H01L 29/47*    (2006.01)
*H01L 21/00*    (2006.01)

(52) U.S. Cl. ............... 257/471; 257/192; 257/E29.041; 257/E29.246; 257/E29.264; 257/E29.317; 257/E29.319; 257/E21.403

(58) Field of Classification Search ............... 257/192, 257/471, E21.403, E29.246, E29.041, E29.317, 257/E29.264, E29.319
See application file for complete search history.

(56) References Cited

U.S. PATENT DOCUMENTS 4,709,251 A    11/1987    Suzuki 6,236,070 B1 *    5/2001    Griffin et al. ............... 257/192
2005/0189561 A1 *    9/2005    Kinzer et al. ............... 257/192
2007/0102727 A1 *    5/2007    Twynam ............... 257/194

FOREIGN PATENT DOCUMENTS

| CN | 1419713 A | 5/2003 |
|---|---|---|
| JP | 2004-31896 A | 1/2004 |
| JP | 2005-317843 A | 11/2005 |
| JP | 2006-100645 A | 4/2006 |

OTHER PUBLICATIONS

Cooper et al., Materials Science Forum vols. 264-268 (1998) pp. 895-900.

* cited by examiner

*Primary Examiner*—Long K Tran
(74) *Attorney, Agent, or Firm*—Birch, Stewart, Kolasch & Birch, LLP (57) ABSTRACT

A semiconductor switching element, wherein on a semiconductor layer formed on a substrate, or on a semiconductor substrate, a source electrode and a drain electrode are disposed at a predetermined interval in a direction along a surface of the substrate; and a second gate electrode is provided between the source electrode and the drain electrode, the second gate electrode is electrically connected with the source electrode and structured with two types of electrode material layers having Schottky barriers of different heights from each other.

13 Claims, 3 Drawing Sheets

SEMICONDUCTOR SWITCHING ELEMENT AND SEMICONDUCTOR CIRCUIT APPARATUS

This Nonprovisional application claims priority under 35 U.S.C. §119(a) on Patent Application 2006-187177 filed in Japan on Jul. 6, 2006, the entire contents of which are hereby incorporated by reference.

BACKGROUND OF THE INVENTION

1. Field of the Invention

The present invention relates to: a semiconductor switching element; and a semiconductor circuit apparatus, such as an inverter circuit and a motor circuit, which requires the flow of current using the semiconductor switching element not only in a forward direction but also in a reverse direction.

2. Description of the Related Art

Some of the semiconductor circuit apparatuses using this type of a semiconductor switching element (e.g., a motor circuit and an inverter circuit) require the flow of the current not only in the forward direction but also in the reverse direction.

Figure 5:
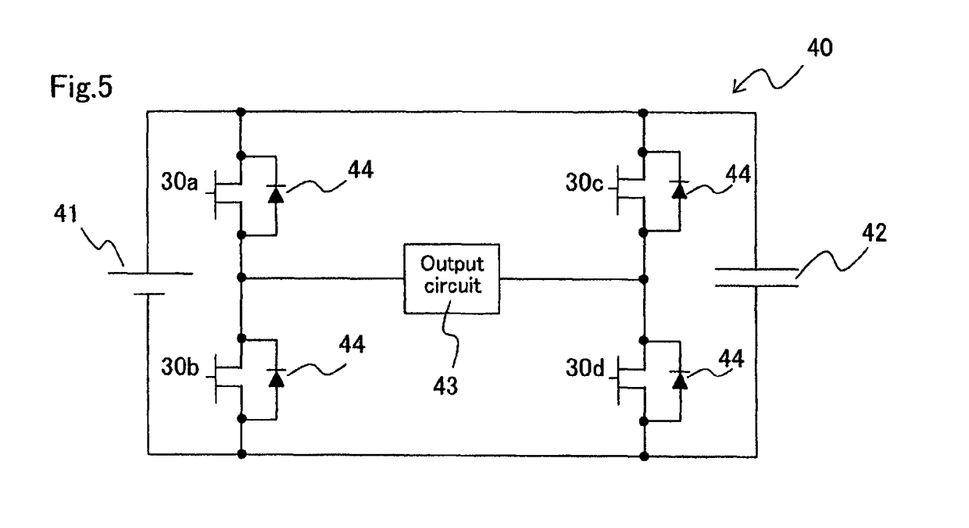
FIG. 5 is a circuit diagram showing an exemplary structure of an inverter circuit using a conventional horizontal semiconductor switching element.

When the current is intended to flow in a reverse bias direction in a conventional semiconductor switching element during an off-state, it is necessary to newly an incorporate diode at both ends of the semiconductor switching element, as shown in FIG. 5.

FIG. 5 is a circuit diagram showing an exemplary structure of an inverter circuit using the conventional semiconductor switching element.

In FIG. 5, for example, in the conventional inverter circuit 40, among four semiconductor switching elements 30a to 30d, two serial circuits, one consisting of the semiconductor switching elements 30a and 30b and the other consisting of the semiconductor switching elements 30a and 30d are connected in parallel between both ends of a power supply 41. Also, a capacitor 42 is connected between both ends of the power supply 41. An output circuit 43 (e.g., motor), which requires the flow of the current not only in the forward direction but also in the reverse direction, is connected between a connecting point of the semiconductor switching elements 30a and 30b making up the one serial circuit and a connecting point of the semiconductor switching elements 30c and 30d making up the other serial circuit.

With the structure described above, in the conventional inverter circuit 40 having a motor circuit structure, when the semiconductor switching elements 30a and 30d are on, and the semiconductor switching elements 30b and 30c are off, current flows from the semiconductor switching element 30a to the semiconductor switching element 30d via the output circuit 43 (e.g., motor). In this case, the current flows to the output circuit 43 (e.g., motor) in the forward direction.

When the semiconductor switching elements 30b and 30c are on, and the semiconductor switching elements 30a and 30d are off, current flows from the semiconductor switching element 30c to the semiconductor switching element 30b via the output circuit 43 (e.g., motor). In this case, the current flows to the output circuit 43 (e.g., motor) in the reverse direction.

Further, when the horizontal semiconductor switching elements 30a to 30d are off, no current flows to the output circuit 43 (e.g., motor), due to the pinch-off of the semiconductor switching elements 30a to 30d.

Therefore, in the inverter circuit 40, in order to make the current flow in the reverse bias direction when the horizontal semiconductor switching elements 30a to 30d are off, diodes 44 for reverse bias operation are connected to the respective semiconductor switching elements 30a to 30d in parallel.

As an exemplary device structure of the semiconductor switching element, for example, Reference 1 proposes a device structure, in which an electrode, made of a high Schottky barrier material Ni and an electrode, made of a low Schottky barrier material Ti are provided on a SiC layer. It is reported that, with Ni electrode having the high Schottky barrier and Ti electrode having the low Schottky barrier, it is possible to realize a low-on resistance, and a pinch-off control by the high Schottky barrier.

Further, Reference 2 discloses a semiconductor apparatus in which a convex AlGaN layer is provided on an n-GaN layer in a diode and two types of anode electrodes having Schottky barriers of different heights are provided on the convex AlGaN layer. In other words, Reference 2 discloses a GaN semiconductor apparatus, in which a first anode electrode having a low Schottky barrier and a second anode electrode having a high Schottky barrier are provided on the convex portion of the surface of the n-GaN layer.

Further, Reference 3 discloses a semiconductor apparatus in which two types of anode electrodes having different widths from each other and having Schottky barriers of different heights are provided in a Schottky diode made of a GaN semiconductor. In other words, Reference 3 discloses the semiconductor apparatus in which a portion of a second anode electrode having a high Schottky barrier is provided so as to contact a first anode electrode having a low Schottky barrier, and the second anode electrode is also in contact with a semiconductor layer.

In addition, Reference 4 discloses a GaN semiconductor integrated circuit in which the Schottky diode described in Reference 3 and a transistor (FET; field-effect transistor) are integrated on the same substrate.

[Reference 1] "J. A. Cooper et al. "Recent Advances in Sic Power Devices." Materials Science Forum vol. 264-268 (1998) pp. 895-900"

[Reference 2] Japanese Laid-Open Publication No. 2004-31896

[Reference 3] Japanese Laid-Open Publication No. 2005-317843

[Reference 4] Japanese Laid-Open Publication No. 2006-100645

SUMMARY OF THE INVENTION

As described above, in the conventional semiconductor circuit apparatus, such as the inverter circuit and the motor circuit, described above which requires the flow of the current not only in the forward direction but also in the reverse direction, when a diode 44 for reverse bias operation is newly incorporated, a problem of increasing the cost occurs, and also a problem of slowing operation speed due to the loss caused by the diode 44 occurs.

The example in Reference 1 merely discloses the exemplary device structure in which the electrode, made of the high Schottky barrier material Ni and the electrode, made of the low Schottky barrier material Ti are provided on the SiC layer. However, Reference 1 does not include a function for operating such that the current flows in both directions of the forward direction and the reverse direction when a semiconductor switching element is on and for operating such that the current flows only in the reverse direction when the semiconductor switching element is off, as the present invention to be described later in detail.

The examples in Reference 2 to Reference 4 provide the two types of anode electrodes having Schottky barriers of different heights on the AlGaN layer. However, Reference 2 to Reference 4 relate to the Schottky diode and are intended to make a rising voltage in the forward direction lower and a dielectric strength in the reverse direction higher, but do not relate to the semiconductor switching element (e.g., MOS transistor (FET; field-effect transistor)) capable of controlling the switching. In Reference 4, a Schottky diode and merely a normal transistor (FET) are individually present on the same substrate.

The present invention is intended to solve the problems described above. The objective of the present invention is to provide: a semiconductor switching element, having a low loss and high dielectric strength, capable of making the current flow in the reverse bias direction even in an off-state; and a semiconductor circuit apparatus, such as an inverter circuit and a motor circuit, which operates at a high speed and can realize a cost-reduction using the semiconductor switching element.

A semiconductor switching element according to the present invention is provided, wherein on a semiconductor layer formed on a substrate or a semiconductor substrate, a source electrode and a drain electrode are disposed at a predetermined interval in a direction parallel to a surface of the substrate; between the source electrode and the drain electrode, a first gate electrode and a second gate electrode are disposed; the first gate electrode is disposed on the source electrode side; the second gate electrode is disposed on the drain electrode side; the second gate electrode and the source electrode are electrically connected to each other; and the second gate electrode is structured with two types of electrode material layers of different heights from each other, thereby the objective described above being achieved. Alternatively, a semiconductor switching element according to the present invention is provided, wherein on a semiconductor layer formed on a substrate, or on a semiconductor substrate, a source electrode and a drain electrode are disposed at a predetermined interval in a direction along a surface of the substrate; and a second gate electrode is provided between the source electrode and the drain electrode, the second gate electrode is electrically connected with the source electrode and structured with two types of electrode material layers having Schottky barriers of different heights from each other, thereby the objective described above being achieved.

Preferably, in a semiconductor switching element according to the present invention, a first gate electrode is further provided between the source electrode and the drain electrode as well as between the second gate electrode and the source electrode.

Preferably, in a semiconductor switching element according to the present invention, the first gate electrode and one of the two types of the electrode material layers of the second gate electrode are structured with an electrode material having a high Schottky barrier, and the other of the two types of the electrode material layers of the second gate electrode is structured with an electrode material having a lower Schottky barrier than that of the one electrode material layer.

Still preferably, the one electrode material layer in a semiconductor switching element according to the present invention is provided as an upper layer on the other electrode material layer, and a predetermined width of the one electrode material layer is connected to the semiconductor substrate or the semiconductor layer on the drain electrode side.

Still preferably, in a semiconductor switching element according to the present invention, the predetermined width of the one electrode material layer in contact with the semiconductor substrate or the semiconductor layer is 0.5 µm or more to 3.0 µm or less.

Still preferably, in a semiconductor switching element according to the present invention, the first gate electrode and the one electrode material layer of the second gate electrode are made of any material of Ti, W, Ag, WN, Pt and Ni or a combination thereof, respectively.

Still preferably, in a semiconductor switching element according to the present invention, the other electrode material layer of the second gate electrode is made of any material of Ni, Pd and Au or a combination thereof.

Still preferably, in a semiconductor switching element according to the present invention, the source electrode and the drain electrode are made of any material of Ti, Hf, Au, Al and W or a combination thereof.

Still preferably, in a semiconductor switching element according to the present invention, the source electrode and the drain electrode are ohmic-connected to the semiconductor substrate or the semiconductor layer, and the first gate electrode and the second gate electrode are Schottky-connected to the semiconductor substrate or the semiconductor layer.

Still preferably, the semiconductor layer in a semiconductor switching element according to the present invention has a laminated structure of any one of a laminated structure in which a GaN layer and an AlGaN layer are laminated, a laminated structure in which the AlGaN layer, the GaN layer and the AlGaN layer are laminated in this order and a laminated structure in which the GaN layer, the AlGaN layer and a GaN cap layer are laminated in this order.

Still preferably, in a semiconductor switching element according to the present invention, the source electrode, the first gate electrode, the second gate electrode and the drain electrode are provided on the GaN layer or the AlGaN layer.

Still preferably, the one electrode material layer in a semiconductor switching element according to the present invention is connected to the source electrode.

Still preferably, the substrate in a semiconductor switching element according to the present invention is a SiC substrate, a sapphire substrate or a Si substrate.

A semiconductor circuit apparatus according to the present invention using one or a plurality of semiconductor switching elements described above according to the present invention, thereby the objective described above being achieved.

Preferably, in a semiconductor circuit apparatus according to the present invention, a first voltage output control section is connected between the source electrode and the drain electrode, wherein the first voltage output control section can selectively perform an output control of a first voltage and a second voltage, and a second voltage output control section is connected between the source electrode and the first gate electrode, wherein the second voltage output control section can selectively perform an output control of a third voltage and a fourth voltage.

Still preferably, the semiconductor switching element in a semiconductor circuit apparatus according to the present invention can be controlled such that when a voltage for switching on an on-state is applied to the first gate electrode and a voltage in a forward direction is applied between the drain electrode and the source electrode, current flows from the drain electrode to the source electrode, when a voltage for switching on the on-state is applied to the first gate electrode and a voltage in a reverse direction is applied between the drain electrode and the source electrode, current flows from the source electrode to the drain electrode, when a voltage for switching on an off-state is applied to the first gate electrode and a voltage in the forward direction is applied between the drain electrode and the source electrode, a path between the drain electrode and the source electrode is electrically insulated, and no current flows between the drain electrode and the source electrode, and when a voltage for switching on the off-state is applied to the first gate electrode and a voltage in the reverse direction is applied between the drain electrode and the source electrode, the electrode material layer having the low Schottky barrier of the second gate electrode is operated and the current flows from the second gate electrode to the drain electrode.

Still preferably, in a semiconductor circuit apparatus according to the present invention, first, second, third and fourth semiconductor switching elements are provided as the semiconductor switching elements, two serial circuits, one consisting of the first and second semiconductor switching elements and the other consisting of the third and fourth semiconductor switching elements are connected between both ends of a power supply, and an output circuit is connected between a connecting point of the first and second semiconductor switching elements and a connecting point of the third and fourth semiconductor switching elements.

Still preferably, a semiconductor circuit apparatus according to the present invention is an inverter circuit or a motor circuit using one or a plurality of horizontal semiconductor switching elements as the semiconductor switching elements.

With the structures described above, hereinafter, the functions of the present invention will be described.

In the present invention, on a semiconductor substrate or a semiconductor layer made of, for example, GaN/AlGaN, a source electrode and a drain electrode made of any material of Ti, Hf, Au, Al, W and the like are disposed at a predetermined interval in a direction parallel to the surface of the substrate; between the source electrode and the drain electrode, a first gate electrode and a second gate electrode are disposed; the first gate electrode is disposed on the source electrode side; the second gate electrode is disposed on the drain electrode side; the second gate electrode and the source electrode are electrically connected to each other; and the second gate electrode is structured with two types of electrode material layers of different heights from each other. The source electrode and the drain electrode are ohmic-connected to the semiconductor substrate or the semiconductor layer. The first gate electrode and the second gate electrode are Schottky-connected to the semiconductor substrate or the semiconductor layer.

As such, in a switching element having the source electrode—the first gate electrode—the second gate electrode—the drain electrode, by structuring the second gate electrode with a combination of electrode materials having Schottky barriers of different heights, it is possible to realize a low-on resistance, and a pinch-off control by the high Schottky barrier.

The first gate electrode and one of the two types of the electrode material layers of the second gate electrode are structured with any electrode material of Ti, W, Ag, WN (i.e., a Tungsten-Nitrogen metal, such as, for example, Tungsten Nitride), Pt, Ni and the like having a high Schottky barrier, and the other of the two types of the electrode material layers of the second gate electrode is structured with any electrode material of Ni, Pd, Au and the like having a low Schottky barrier.

In this switching element, when a voltage for switching on the on-state is applied to the first gate electrode and a voltage in a forward direction is applied between the drain electrode and the source electrode, current flows from the drain electrode side to the source electrode side. Also, when a voltage for switching on the on-state is applied to the first gate electrode and a voltage in a reverse direction is applied between the drain electrode and the source electrode, current flows from the source electrode side to the drain electrode side.

Thus, in the semiconductor switching element, it is possible to make the current flow in both directions.

When a voltage for switching on the off-state is applied to the first gate electrode and a voltage in the forward direction is applied between the drain electrode and the source electrode, the path between the drain electrode and the source electrode is pinched off by the first gate electrode and the second gate electrode, and it is electrically insulated. Thus, no current flows between the drain electrode and the source electrode.

Further, when a voltage for switching on the off-state is applied to the first gate electrode and a voltage in the reverse direction is applied between the drain electrode and the source electrode, the path between the drain electrode and the source electrode is pinched off by the first gate electrode, and it is electrically insulated. Thus, no current flows between the drain electrode and the source electrode. However, the electrode material layer having the low Schottky barrier of the second gate electrode is operated and the current flows from the second gate electrode to the drain electrode. Accordingly, no diode is required as required conventionally. When a voltage value (absolute value) between the drain electrode and the source electrode is further increased, the electrode material layer having the high Schottky barrier of the second gate electrode is operated as well.

As described above, the semiconductor switching element according to the present invention can perform a quick switching in both the forward direction and the reverse direction with a low loss and a high dielectric strength, without providing a new component, such as a diode for reverse bias operation as provided conventionally. For example, in a semiconductor circuit apparatus, such as an inverter circuit and a motor circuit, by using one or a plurality of such semiconductor switching elements, it is possible to make the current flow in the reverse direction even in an off-state, which results in higher operation speed and cost-reduction.

These and other advantages of the present invention will become apparent to those skilled in the art upon reading and understanding the following detailed description with reference to the accompanying figures.

BRIEF DESCRIPTION OF THE DRAWINGS

Portions (a) to (d) of FIG. 3 are longitudinal sectional views for describing the switching operation of the semiconductor switching element in FIG. 1.

1 substrate
2 buffer layer
3 GaN layer
4 AlGaN layer
5 source electrode
6 first gate electrode
7 second gate electrode
7a electrode material layer having a low Schottky barrier
7b electrode material layer having a high Schottky barrier
8 drain electrode 10, 10a to 10d semiconductor switching element
20 inverter circuit
21 power supply
22 capacitor
23 output circuit (motor)
Vds voltage applied between the drain electrode and the source electrode
Vgs voltage applied to the first gate electrode

DESCRIPTION OF THE PREFERRED EMBODIMENTS

Hereinafter, a case in which an embodiment of a semiconductor switching element according to the present invention is applied to a GaN semiconductor switching element will be described in detail with reference to the accompanying drawings. The GaN semiconductor switching element has an advantage since a Schottky electrode therein has a high dielectric strength.

Figure 1:
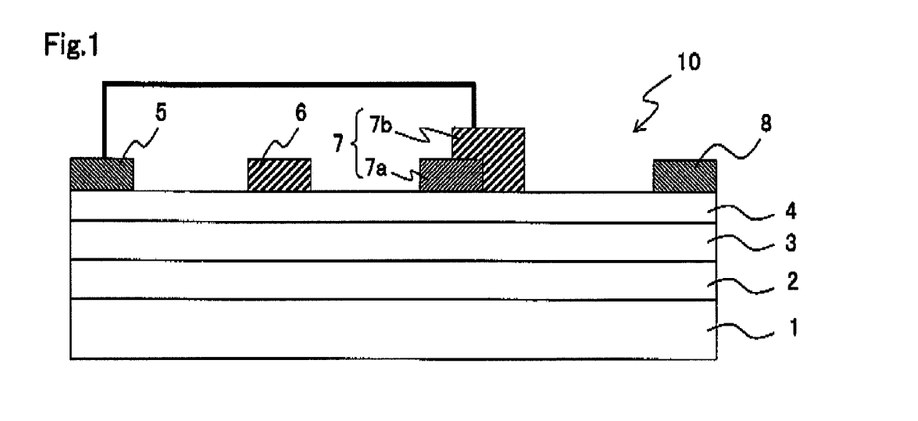
FIG. 1 is a longitudinal sectional view showing a structural example of a GaN semiconductor switching element according to an embodiment of the present invention.

FIG. 1 is a longitudinal sectional view showing an essential structural example of the GaN semiconductor switching element according to the embodiment of the present invention.

In FIG. 1, in the GaN semiconductor switching element 10 according to the present embodiment, a buffer layer 2 is formed on a substrate 1, and a GaN layer 3 and an AlGaN layer 4 as a semiconductor layer are formed on the buffer layer 2 in this order. Due to the strain generated at a border of the GaN layer 3/AlGaN layer 4, a two dimensional electron gas (2DEG) is generated. On the AlGaN layer 4, a source electrode 5 and a drain electrode 8 are disposed at a predetermined interval in a direction parallel to the surface of the substrate 1 (in a direction along a substrate surface). The source electrode 5 and the drain electrode 8 are made of any material (or metal material) of Ti, Hf, Au, Al and W or a combination thereof, and they are ohmic-connected to the AlGaN layer 4 as the semiconductor layer.

Between the source electrode 5 and the drain electrode 8, a first gate electrode 6 and a second gate electrode 7 are disposed. The first gate electrode 6 is disposed on the source electrode 5 side. The second gate electrode 7 is disposed on the drain electrode 8 side. Using the two gate electrode in this manner can improve the dielectric strength (see paragraphs [0007] to [0009] of Reference 2). The second gate electrode 7 is structured with two types of electrode material layers 7a and 7b having different Schottky barriers from each other. The height of the Schottky barrier of the electrode material layer 7b is higher than the height of the Schottky barrier of the electrode material layer 7a. In other words, the first gate electrode 6 and the one electrode material layer 7b of the two types of the electrode material layers of the second gate electrode 7 are structured with an electrode material having a high Schottky barrier, and the other electrode material layer 7a of the two types of the electrode material layers of the second gate electrode 7 is structured with an electrode material having a Schottky barrier lower than that of the one electrode material layer 7b.

Specifically, Pt is used for the first gate electrode 6 and the electrode material layer 7b, and Ni is used for the electrode material layer 7a. However, the present invention is not limited to this combination. For the first gate electrode 6 and the electrode material layer 7b, any material of Ti, W, Ag, WN, Pt and Ni or a combination thereof can be used, and for the electrode material layer 7a, any material of Ni, Pd and Au or a combination thereof can be used. The first electrode 6, the electrode material layer 7a and the electrode material layer 7b are Schottky-connected to the AlGaN layer 4.

A portion of the electrode material layer 7b covers a portion of the electrode material layer 7a as an upper layer, and the portion of the electrode material layer 7b is protruded by a predetermined width on the drain electrode 8 side. In other words, the electrode material layer 7b is provided as the upper layer on the electrode material layer 7a, and the predetermined width of the electrode material layer 7b is connected to the AlGaN layer 4 as the semiconductor layer on the drain electrode 8 side. The connection surface between the electrode material layer 7b and the AlGaN layer 4 has the predetermined width, and the predetermined protruding width is preferably in a range between 0.5 µm (including 0.5 µm) and 3.0 µm (including 3.0 cm), for example. If the protruding width (predetermined width) of the electrode material layer 7b is narrower than 0.5 µm, the dielectric strength is decreased. A width wider than 3.0 µm results in a decrease of a current value. When the electrode material layer 7b is protruded on the source electrode 5 side, which is located on the opposite side of the drain electrode 8, this is not preferable since it becomes a cause of increasing the resistance by the Schottky barrier.

With the structure described above, hereinafter, the switching operation of the semiconductor switching element 10 according to the present embodiment will be described in detail with reference to FIG. 2 and FIG. 3.

Figure 2:
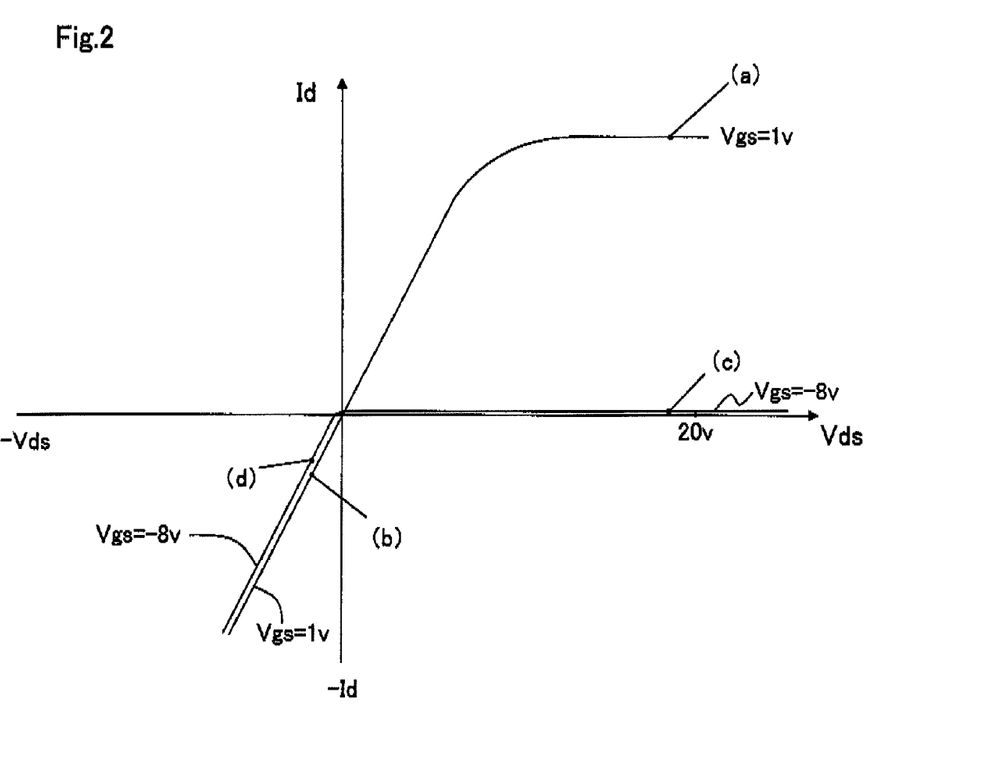
FIG. 2 is a graph showing the voltage-current characteristic of the semiconductor switching element in FIG. 1.

FIG. 2 is a graph showing the voltage-current characteristic of the semiconductor switching element 10 in FIG. 1. FIG. 3 is a longitudinal sectional view for describing the switching operation of the semiconductor switching element 10 in FIG. 1.

As shown in FIG. 2, the horizontal axis shows voltages Vds and −Vds applied between the drain electrode 8 and the source electrode 5 of the semiconductor switching element 10. The right side with respect to the origin (crossing point between the vertical axis and the horizontal axis) shows when a voltage in the forward direction is applied, and the left side with respect to the origin shows when a voltage in the reverse direction is applied. The vertical axis shows currents Id and −Id flowing between the drain electrode 8 and the source electrode 5. The upper side with respect to the origin shows the current Id flowing from the drain electrode 8 side to the source electrode 5 side, and the lower side with respect to the origin shows the current −Id flowing from the source electrode 5 side to the drain electrode 8 side.

Figure 3:
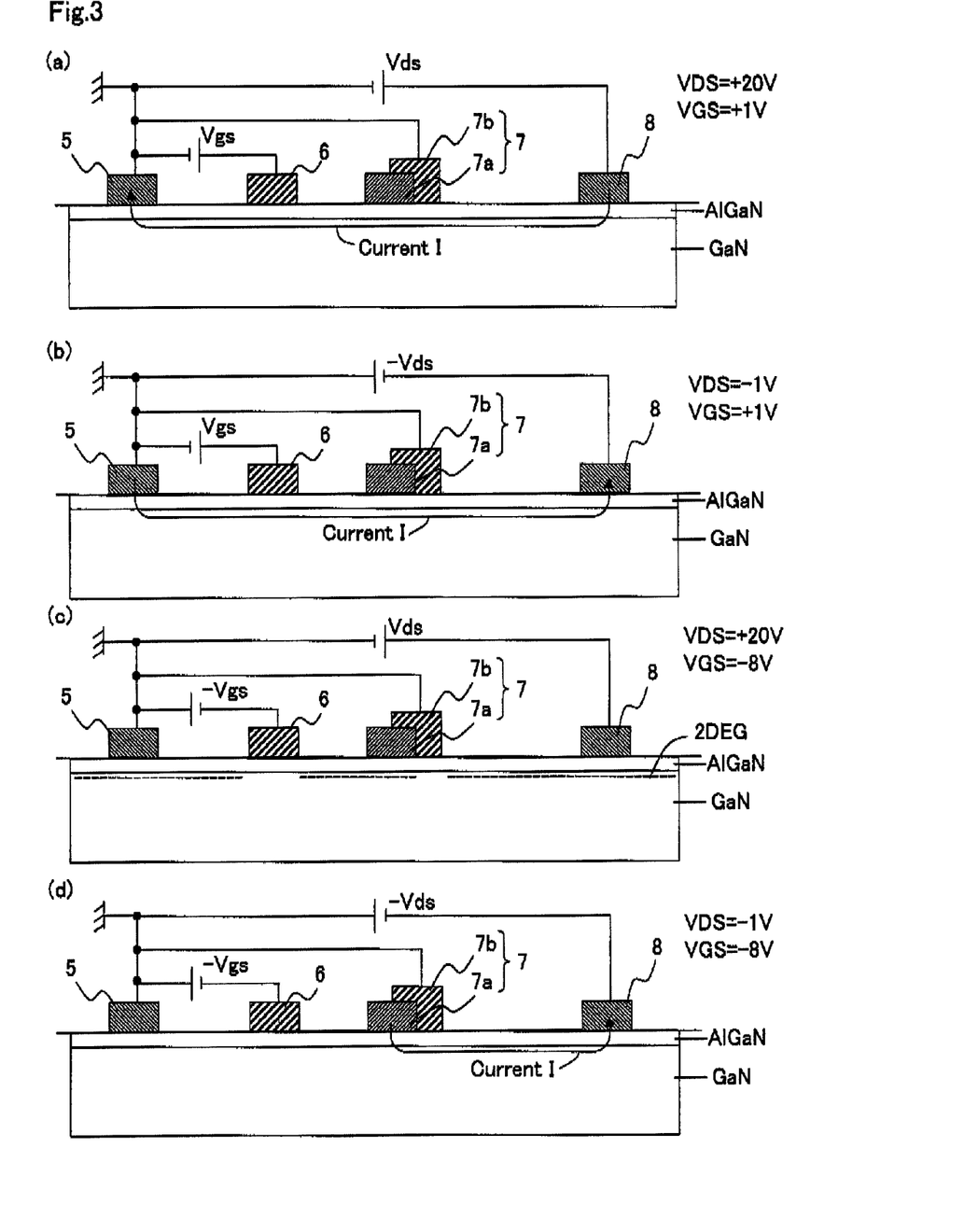

In Portion (a) of FIG. 3 and Portion (b) of FIG. 3, a first voltage output control section (not shown) is connected between the source electrode 5 and the drain electrode 8, wherein the first voltage output control section can selectively perform an output control of a first voltage Vds (herein, 20V) and a second voltage −Vds (herein, −1V), and a second voltage output control section (not shown) is connected between the source electrode 5 and the first gate electrode 6, wherein the second voltage output control section can selectively perform an output control of a third voltage Vgs (herein, 1V) and a fourth voltage −Vgs (herein, −8V). The source electrode 5 and the electrode material layer 7b of the second gate electrode 7 are connected to each other and grounded.

In characteristic (a) in FIG. 2, the voltage Vgs for switching on the on-state is applied to the first gate electrode 6 and the semiconductor switching element 10 is placed on the on-state. Between the drain electrode 8 and the source electrode 5, the voltage Vds in the forward direction is applied. In this case, when it is assumed that the voltage Vds between the drain electrode 8 and the source electrode 5 is 20V and the voltage Vgs between the first gate electrode 6 and the source electrode 5 is 1V, the current Id shown in characteristic (a) in FIG. 2 flows from the drain electrode 8 to the source electrode 5 as shown in Portion (a) of FIG. 3.

In characteristic (b) in FIG. 2, the voltage Vgs for switching on the on-state is applied to the first gate electrode 6 and the semiconductor switching element 10 is placed on the on-state. Between the drain electrode 8 and the source electrode 5, the voltage −Vds in the reverse direction is applied. In this case, when it is assumed that the voltage −Vds between the drain electrode 8 and the source electrode 5 is −1V and the voltage Vgs between the first gate electrode 6 and the source electrode 5 is 1V, the current −Id shown in characteristic (b) in FIG. 2 flows from the source electrode 5 to the drain electrode 8 as shown in Portion (b) of FIG. 3.

In characteristic (c) in FIG. 2, the voltage −Vgs for switching on the off-state is applied to the first gate electrode 6 and the semiconductor switching element 10 is placed on the off-state. Between the drain electrode 8 and the source electrode 5, the voltage Vds in the forward direction is applied. In this case, when it is assumed that the voltage Vds between the drain electrode 8 and the source electrode 5 is 20V and the voltage −Vgs between the first gate electrode 6 and the source electrode 5 is −8V, the channel layer (2DEG) is cut, as shown in Portion (c) of FIG. 3, by a depletion layer of a dotted line portion under the source electrode 5, the first gate electrode 6, the second gate electrode 7 and the drain electrode 8. Thus, the current I in the forward direction is blocked and the path between the drain electrode 8 and the source electrode 5 is electrically insulated, and as a result, the current Id does not flow in the path between the drain electrode 8 and the source electrode 5. Any one of the two Schottky electrodes 7a and 7b of the second gate electrode 7 can be disposed at the top of the other. However, due to the pinch-off, it is necessary to make the barrier of the Schottky electrode 7b higher than the barrier of the Schottky electrode 7a. Herein, the 2DEG refers to the two dimensional electron gas as described above, and it exists at an interface between the AlGaN layer and the GaN layer (at the surface of the GaN layer). The interface functions as the channel.

In characteristic (d) in FIG. 2, the voltage −Vgs for switching on the off-state is applied to the first gate electrode 6 and the semiconductor switching element 10 is placed on the off-state. Between the drain electrode 8 and the source electrode 5, the voltage −Vds in the reverse direction is applied. In this case, when it is assumed that the voltage −Vds between the drain electrode 8 and the source electrode 5 is −1V and the voltage −Vgs between the first gate electrode 6 and the source electrode 5 is −8V, the path between the source electrode 5 and the drain electrode 8 is pinched off, as shown in Portion (d) of FIG. 3, by the first gate electrode 6 and it is electrically insulated. However, the current Id flows between the electrode material layer 7a, which has the low Schottky barrier of the second gate electrode 7, and the drain electrode 8. In other words, when a voltage is applied to the second gate electrode 7 in the forward direction, the electrode material layer 7a having the low Schottky barrier is first operated and the current Id flows between the electrode material layer 7a and the drain electrode 8. When the voltage is further increased, then the electrode material layer 7b having the high Schottky barrier is operated.

As such, the semiconductor switching element 10 according to the present embodiment is operated such that the currents Id and −Id flow in both directions of the forward direction and the reverse direction when the semiconductor switching element 10 is in the on-state, and it is operated such that the current Id flows only in the reverse direction when the semiconductor switching element 10 is in the off-state.

As described above, in the inverter circuit 40 using the conventional semiconductor switching element 30 shown in FIG. 5, when it is assumed that the output circuit 43 is, for example, a motor, the diode 44 for reverse bias operation is required.

An inverter circuit as the semiconductor circuit apparatus using the semiconductor switching elements 10 according to the present embodiment will be described in detail with respect to FIG. 4.

Figure 4:
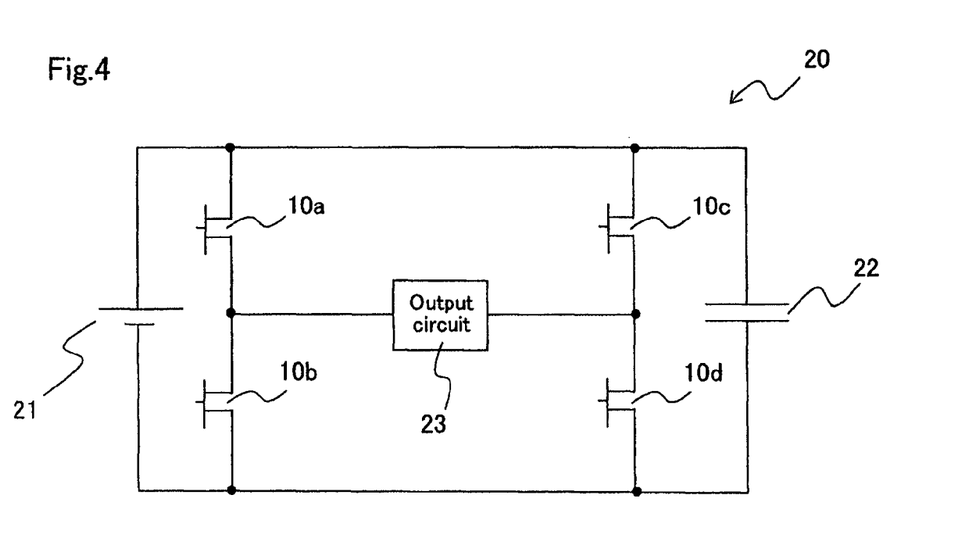
FIG. 4 is a circuit diagram showing an exemplary structure of an inverter circuit according to the present invention, using the semiconductor switching elements in FIG. 1.

FIG. 4 is a circuit diagram showing an exemplary structure of the inverter circuit using the semiconductor switching elements 10 in FIG. 1.

In FIG. 4, in an inverter circuit 20 according to the present embodiment, as the semiconductor switching elements 10, among four horizontal semiconductor switching elements 10a to 10d, two serial circuits, one consisting of the semiconductor switching elements 10a and 10b and the other consisting of the semiconductor switching elements 10c and 10d are connected in parallel between both ends of a power supply 21. Also, a capacitor 22 is connected between both ends of the power supply 21. An output circuit 23 (e.g., motor), which requires the flow of the current not only in the forward direction but also in the reverse direction, is connected between a connecting point of the semiconductor switching elements 10a and 10b and a connecting point of the semiconductor switching elements 10c and 10d.

With the structure described above, when the horizontal semiconductor switching elements 10a and 10d are on and the semiconductor switching elements 10b and 10c are off, current flows from the semiconductor switching element 10a to the semiconductor switching element 10d via the output circuit 23 (e.g., motor). In this case, the current flows to the output circuit 23 (e.g., motor) in the forward direction.

When the semiconductor switching elements 10b and 10c are on and the semiconductor switching elements 10a and 10d are off, current flows from the semiconductor switching element 10c to the semiconductor switching element 10b via the output circuit 23 (e.g., motor). In this case, the current flows to the output circuit 23 (e.g., motor) in the reverse direction.

Further, when the horizontal semiconductor switching elements 10a to 10d are off, no current flows to the output circuit 23 (e.g., motor), due to the pinch-off of the semiconductor switching elements 10a to 10d.

Therefore, in the inverter circuit 20, it is possible to make the current flow in the reverse bias direction when the horizontal semiconductor switching elements 10a to 10d are off. In this case, it is not necessary to connect a diode for reverse bias operation in parallel to the semiconductor switching element as conventionally performed.

Thus, the inverter circuit 20 is a motor circuit, the semiconductor switching elements 10a to 10d operate such that they can selectively make the current flow in both directions of the forward direction and the reverse direction when the semiconductor switching elements 10a to 10d are on and operate such that they can make the current flow only in the reverse direction when the semiconductor switching elements 10a to 10d are off. As describe above, the semiconductor switching elements 10 (10a to 10d) can operate in both directions of the forward direction and the reverse direction. Thus, a diode for reverse bias operation is not required as described above, which results in cost-reduction for manufacturing and higher operation speed.

As described above, according to the present invention, on the GaN layer 3/AlGaN layer 4, the source electrode 5 and the drain electrode 8, which made of any material of Ti, Hf, Au, Al, W and the like, are disposed at a predetermined interval in a direction parallel to the surface of the substrate 1 (or in a direction along a substrate surface). Between the source electrode 5 and the drain electrode 8, a first gate electrode 6 and a second gate electrode 7 are disposed. The first gate electrode 6 is disposed on the source electrode 5 side. The second gate electrode 7 is disposed on the drain electrode 8 side. The electrode material layer 7b of the second gate electrode 7 and the source electrode 5 are electrically connected to each other. The second gate electrode 7 is structured with two types of the electrode material layers 7a and 7b having Schottky barriers of different heights. The first gate electrode 6 and the electrode material layer 7b of the second electrode 7 are structured with an electrode material having a high Schottky barrier, such as Ni, Pd, Au, and the electrode material layer 7a of the second electrode 7 is structured with an electrode material having a low Schottky barrier, such as Ti, W, Ag, WN, Pt and Ni. In this manner, it is possible to obtain the semiconductor switching element 10, having a low loss, capable of making the current flow in the reverse bias direction even in an off-state.

The embodiment described above has not made a specific description. However, the material for the semiconductor layer for forming the Schottky electrode is not limited to AlGaN. Additionally, when AlGaN is used as the material for the semiconductor layer, it is preferable to use a SiC substrate, a sapphire substrate, a Si substrate or the like as the substrate 1, which can grow a crystal of the GaN layer 3/AlGaN layer 4 in an excellent condition.

The embodiment described above has not made a specific description. However, as a semiconductor structure, an AlN layer can be further disposed between the buffer layer 2 and the substrate 1. In addition, as a semiconductor structure, a GaN cap layer can be further disposed on the AlGaN layer 4. Further, a drain electrode and a source electrode can be disposed on the GaN layer. In other words, as a semiconductor layer, any one of a laminated structure in which the GaN layer 3 and the AlGaN layer 4 are laminated in this order, a laminated structure in which the AlGaN layer 4 and the GaN layer 3 are laminated in this order, a laminated structure in which the AlGaN layer, the GaN layer and the AlGaN layer are laminated in this order and a laminated structure in which the GaN layer 3, the AlGaN layer 4 and the GaN layer (cap layer) are laminated in this order can be applied to the present invention. In this case, the source electrode 5, the first gate electrode 6, the second gate electrode 7 and the drain electrode 8 are provided on the GaN layer or the AlGaN layer.

Further, the present embodiment has described the case in which on the semiconductor layer (GaN layer 3/AlGaN layer 4) formed on the substrate 1, the source electrode 5 and the drain electrode 8 are disposed at a predetermined interval in a direction along the surface of the substrate 1; between the source electrode 5 and the drain electrode 8, the first gate electrode 6 and the second gate electrode 7 are disposed; the first gate electrode 6 is disposed on the source electrode 5 side; the second gate electrode 7 is disposed on the drain electrode 8 side; the second gate electrode 7 and the source electrode 5 are electrically connected to each other; and the second gate electrode 7 is structured with the two types of the electrode material layers 7a and 7b having Schottky barriers of different heights from each other. However, the present invention is not limited to this. The present invention can have a structure in which on a semiconductor substrate having a source region, a channel region and a drain region formed thereon, the source electrode 5 and the drain electrode 8 are disposed at a predetermined interval in a direction along the surface of the substrate; between the source electrode 5 and the drain electrode 8, the first gate electrode 6 and the second gate electrode 7 are disposed; the first gate electrode 6 is disposed on the source electrode 5 side; the second gate electrode 7 is disposed on the drain electrode 8 side; the second gate electrode 7 and the source electrode 5 are electrically connected to each other; and the second gate electrode 7 is structured with the two types of the electrode material layers 7a and 7b having Schottky barriers of different heights from each other.

Further, the present embodiment has described the case in which the embodiment of the semiconductor switching element according to the present invention is applied to the GaN semiconductor switching element. However, the present invention is not limited to this. The embodiment of the semiconductor switching element according to the present invention can be applied to a SiC semiconductor switching element.

In the semiconductor switching element 10 in which current can flow between the source electrode 5 and the drain electrode 8 in both directions, on a semiconductor layer formed on the substrate 1, or on a semiconductor layer, the source electrode 5 and the drain electrode 8 are disposed at a predetermined interval in a direction along a surface of the substrate; and between the source electrode 5 and the drain electrode 8, the second gate electrode 7 is provided, wherein the second gate electrode 7 is electrically connected to the source electrode 5 and is structured the two types of the electrode material layers having different Schottky barriers from each other. Thus, it is possible to obtain the semiconductor switching element 10, having a low loss, capable of making the current flow in the reverse bias direction even in an off-state.

As described above, the present invention is exemplified by the use of its preferred embodiment(s). However, the present invention should not be interpreted solely based on the embodiment(s) described above. It is understood that the scope of the present invention should be interpreted solely based on the claims. It is also understood that those skilled in the art can implement equivalent scope of technology, based on the description of the present invention and common knowledge from the description of the detailed preferred embodiment(s) of the present invention. Furthermore, it is understood that any patent, any patent application and any references cited in the present specification should be incorporated by reference in the present specification in the same manner as the contents are specifically described therein.

INDUSTRIAL APPLICABILITY

In the field of: a semiconductor switching element (e.g., a horizontal semiconductor switching element) used in a semiconductor device which requires the flow of current not only in a forward direction but also in a reverse direction; and an inverter circuit or a motor circuit using the semiconductor switching element, the semiconductor switching element according to the present invention can perform a quick switching in both directions of the forward direction and the reverse direction with a low loss, without providing a new component, such as a diode for reverse bias operation as provided conventionally. For example, in a semiconductor circuit apparatus, such as the inverter circuit and the motor circuit, by using one or a plurality of such semiconductor switching elements, it is possible to make the current flow in the reverse direction even in an off-state, which results in higher operation speed and cost-reduction.

What is claimed is:
1. A semiconductor switching element, wherein on a semiconductor layer formed on a substrate, or on a semiconductor substrate, a source electrode and a drain electrode are disposed at a predetermined interval in a direction along a surface of the substrate; and a second gate electrode is provided between the source electrode and the drain electrode, the second gate electrode is electrically connected with the source electrode and structured with two electrode material layers having Schottky barriers, where each electrode material layer are of different heights above the semiconductor layer or semiconductor substrate and are connected to the semiconductor layer or the semiconductor substrate.

2. A semiconductor switching element according to claim 1, wherein the source electrode and the drain electrode are made of any material of Ti, Hf, Au, Al and W or a combination thereof.

3. A semiconductor switching element according to claim 1, wherein the substrate is a SiC substrate, a sapphire substrate or a Si substrate.

4. A semiconductor switching element according to claim 1, wherein the semiconductor layer has a laminated structure of any one of a laminated structure in which a GaN layer and an AlGaN layer are laminated, a laminated structure in which the AlGaN layer, the GaN layer and the AlGaN layer are laminated in this order and a laminated structure in which the GaN layer, the AlGaN layer and a GaN cap layer are laminated in this order.

5. A semiconductor switching element according to claim 4, wherein the source electrode, the first gate electrode, the second gate electrode and the drain electrode are provided on the GaN layer or the AlGaN layer.

6. A semiconductor switching element according to claim 1, further comprising a first gate electrode between the source electrode and the drain electrode as well as between the second gate electrode and the source electrode.

7. A semiconductor switching element according to claim 6, wherein the source electrode and the drain electrode are ohmic-connected to the semiconductor substrate or the semiconductor layer, and the first gate electrode and the second gate electrode are Schottky-connected to the semiconductor substrate or the semiconductor layer.

8. A semiconductor switching element according to claim 6, wherein the first gate electrode and one of the electrode material layers of the second gate electrode are structured with an electrode material having a high Schottky barrier, and the other of the electrode material layers of the second gate electrode is structured with an electrode material having a lower Schottky barrier than that of the one electrode material layer.

9. A semiconductor switching element according to claim 8, wherein the one electrode material layer is provided as an upper layer on the other electrode material layer, and a predetermined width of the one electrode material layer is connected to the semiconductor substrate or the semiconductor layer on the drain electrode side.

10. A semiconductor switching element according to claim 9, wherein the predetermined width of the one electrode material layer in contact with the semiconductor substrate or the semiconductor layer is 0.5 µm or more to 3.0 µm or less.

11. A semiconductor switching element according to claim 8, wherein the first gate electrode and the one electrode material layer of the second gate electrode are made of any material of Ti, W, Ag, WN, Pt and Ni or a combination thereof, respectively.

12. A semiconductor switching element according to claim 8, wherein the other electrode material layer of the second gate electrode is made of any material of Ni, Pd and Au or a combination thereof.

13. A semiconductor switching element according to claim 8, wherein the one electrode material layer is connected to the source electrode.

* * * * *